United States Patent
Mori et al.

(10) Patent No.: US 12,362,310 B2
(45) Date of Patent: Jul. 15, 2025

(54) MULTI-LAYER SHEET FOR MOLD UNDERFILL ENCAPSULATION, METHOD FOR MOLD UNDERFILL ENCAPSULATION, ELECTRONIC COMPONENT MOUNTING SUBSTRATE, AND PRODUCTION METHOD FOR ELECTRONIC COMPONENT

(71) Applicant: Nagase ChemteX Corporation, Osaka (JP)

(72) Inventors: Daisuke Mori, Hyogo (JP); Masahiro Asahara, Hyogo (JP); Katsushi Kan, Hyogo (JP); Eiichi Nomura, Hyogo (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 583 days.

(21) Appl. No.: 17/633,598

(22) PCT Filed: Aug. 3, 2020

(86) PCT No.: PCT/JP2020/029714
§ 371 (c)(1),
(2) Date: Feb. 8, 2022

(87) PCT Pub. No.: WO2021/029259
PCT Pub. Date: Feb. 18, 2021

(65) Prior Publication Data
US 2022/0310546 A1   Sep. 29, 2022

(30) Foreign Application Priority Data
Aug. 9, 2019   (JP) ................................ 2019-147590

(51) Int. Cl.
*H01L 23/00*   (2006.01)
*H01L 21/56*   (2006.01)
(Continued)

(52) U.S. Cl.
CPC ............ *H01L 24/29* (2013.01); *H01L 21/566* (2013.01); *H01L 23/295* (2013.01);
(Continued)

(58) Field of Classification Search
CPC ... H01L 23/3135; H01L 24/16; H01L 23/293; H01L 24/32; H01L 24/83; H01L 24/29;
(Continued)

(56) References Cited

U.S. PATENT DOCUMENTS

2003/0112986 A1*   6/2003   Furukawa ............ H03H 9/1078
381/190
2003/0159276 A1*   8/2003   Wakefield ............... H01L 24/85
29/827

(Continued)

FOREIGN PATENT DOCUMENTS

JP   2012-054363 A   3/2012
JP   2012-059743 A   3/2012
(Continued)

OTHER PUBLICATIONS

WIPO, International Search Report for International Application No. PCT/JP2020/029714, Oct. 13, 2020.
(Continued)

*Primary Examiner* — Mouloucoulaye Inoussa

(57) ABSTRACT

[Problem] To provide a multi-layer sheet for mold underfill encapsulation, which exhibits good infiltrability between electrodes. [Solution] In order to solve the aforementioned problem, the present invention provides a multi-layer sheet for mold underfill encapsulation, which is characterized by having provided as an outermost layer thereof an (A) layer that comprises a resin composition having a local maximum loss tangent (tan δ) value of 3 or more at a measurement temperature of 125° C. for a measurement time of 0-100 seconds.

11 Claims, 4 Drawing Sheets

(51) Int. Cl.
  *H01L 23/29* (2006.01)
  *H01L 23/31* (2006.01)
  *H01L 25/065* (2023.01)
(52) U.S. Cl.
  CPC .......... *H01L 23/3135* (2013.01); *H01L 24/16* (2013.01); *H01L 24/32* (2013.01); *H01L 24/73* (2013.01); *H01L 24/83* (2013.01); *H01L 24/17* (2013.01); *H01L 25/0655* (2013.01); *H01L 2224/1601* (2013.01); *H01L 2224/16225* (2013.01); *H01L 2224/1713* (2013.01); *H01L 2224/29005* (2013.01); *H01L 2224/29019* (2013.01); *H01L 2224/2939* (2013.01); *H01L 2224/29541* (2013.01); *H01L 2224/29553* (2013.01); *H01L 2224/29562* (2013.01); *H01L 2224/2957* (2013.01); *H01L 2224/2999* (2013.01); *H01L 2224/32225* (2013.01); *H01L 2224/73204* (2013.01); *H01L 2224/83204* (2013.01); *H01L 2924/3511* (2013.01)
(58) Field of Classification Search
  CPC ..... H01L 21/566; H01L 24/73; H01L 21/563; H01L 21/56; H01L 23/295; H01L 24/13; H01L 25/0655; H01L 24/17; H01L 23/49822; H01L 23/5389; H01L 23/498; H01L 23/552; H01L 23/49833; H01L 25/105; H01L 21/561; H01L 21/565; H01L 23/3121; H01L 23/31; H01L 2224/29541; H01L 2224/29562; H01L 2224/1601; H01L 2224/2939; H01L 2224/13139; H01L 2224/13109; H01L 2224/73204; H01L 2224/131; H01L 2224/32225; H01L 2224/13111; H01L 2224/2999; H01L 2924/3511; H01L 2224/83204; H01L 2224/29005; H01L 2224/81399; H01L 2224/13118; H01L 2224/13144; H01L 2224/16225; H01L 2224/16227; H01L 2224/1713; H01L 2224/13147; H01L 2224/2957; H01L 2224/29019; H01L 2224/13116; H01L 2224/1312; H01L 2224/29553; H01L 2924/181; H01L 2224/13113; H01L 2924/00012; H01L 2924/014; H01L 2924/01049; H01L 2924/0105; H01L 2924/01083; H01L 2924/00014; H01L 2924/01082; H01L 2224/12105; H01L 2224/04105; H01L 23/49816; H01L 2224/48091; H01L 2225/1088; B32B 27/20; C08G 59/686; C08G 59/42; C08G 59/621; C08G 59/5033; C08K 3/36; C08K 3/34; C08K 3/04; C08K 5/5425; C08K 2201/003; C08L 33/06; C08J 5/042; C08J 5/249; C08J 5/243; C08J 2377/00; C08J 2363/00; C08J 2363/02; C08J 2371/00; C08J 2463/02; C08J 2471/10; Y02T 50/40

See application file for complete search history.

(56) References Cited

U.S. PATENT DOCUMENTS

| | | | | |
|---|---|---|---|---|
| 2007/0018539 | A1* | 1/2007 | Nagashima | H01L 24/97 310/348 |
| 2008/0272858 | A1* | 11/2008 | Furihata | H03H 9/02984 257/E23.125 |
| 2011/0241203 | A1* | 10/2011 | Nakasato | H05K 1/185 257/737 |
| 2012/0055015 | A1 | 3/2012 | Toyoda et al. | |
| 2013/0082367 | A1* | 4/2013 | Yoo | H01L 25/0655 438/584 |
| 2020/0127635 | A1* | 4/2020 | Matsumoto | H03H 9/725 |
| 2020/0207915 | A1* | 7/2020 | Ashibe | G06F 3/041 |
| 2020/0273839 | A1* | 8/2020 | Elsherbini | H01L 24/17 |
| 2020/0299476 | A1* | 9/2020 | Aizawa | C08J 5/042 |
| 2020/0312783 | A1* | 10/2020 | Min | H01L 23/49822 |
| 2020/0388509 | A1* | 12/2020 | Nomura | H01L 23/293 |
| 2021/0187923 | A1* | 6/2021 | Murai | C09J 133/14 |
| 2021/0296544 | A1* | 9/2021 | Yamamoto | H01L 33/54 |
| 2022/0037221 | A1* | 2/2022 | Arayama | C08G 59/621 |
| 2022/0189907 | A1* | 6/2022 | Nam | H01L 21/56 |
| 2022/0293138 | A1* | 9/2022 | Kawasaki | H01L 23/3121 |
| 2022/0365456 | A1* | 11/2022 | Danno | G03G 9/08797 |

FOREIGN PATENT DOCUMENTS

| | | |
|---|---|---|
| JP | 2015-71670 A | 4/2015 |
| JP | 2015-216230 A | 12/2015 |
| JP | 2018-174242 A | 11/2018 |

OTHER PUBLICATIONS

WIPO, Written Opinion for International Application No. PCT/JP2020/029714, Oct. 13, 2020.

* cited by examiner

MULTI-LAYER SHEET FOR MOLD UNDERFILL ENCAPSULATION, METHOD FOR MOLD UNDERFILL ENCAPSULATION, ELECTRONIC COMPONENT MOUNTING SUBSTRATE, AND PRODUCTION METHOD FOR ELECTRONIC COMPONENT

TECHNICAL FIELD

The present invention relates to a multi-layer sheet for mold underfill encapsulation and a method for mold underfill encapsulation.

BACKGROUND ART

As size reduction and thickness reduction of electronic equipment are in progress, there has been a demand for space saving even in integrated circuits seated on circuit boards, and it has become necessary to increase the density in order to rapidly transmit many signals. Due to the density increase for rapidly transmitting many signals, a flip-chip connection method, which facilitates multi-pin usage and high-speed processing, has been widely employed in recent years for the connection between an electronic component such as a semiconductor chip (hereinafter, referred to as "electronic component") and a package substrate or the like. Electronic components have been subjected to encapsulation using an encapsulation resin or the like in order to block external dust, moisture, and the like, and the encapsulation of an electronic component connected by the flip-chip connection method is commonly carried out by methods of underfilling the gaps between electronic components and a package substrate with a liquid or slurry-like encapsulant material with fluidity and then overmolding the electronic components and the package substrate with another liquid or slurry-like encapsulant material or an encapsulant film.

Since these methods of carrying out underfilling followed by overmolding require a large number of steps and man-hours, a mold underfill material with which underfilling and overmolding can be carried out at the same time has been proposed (Patent Document 1).

CITATION LIST

Patent Document

Patent Document 1: JP 2015-71670 A

SUMMARY OF THE INVENTION

Problem to be Solved by the Invention

However, in recent years, integrated circuits that are utilized for IOT, automated driving, and the like are connected to a substrate or the like by many electrodes in order to further increase the density of electronic components. Accordingly, even in a single chip or the like, the distance between electrodes is becoming narrower, and the infiltration of conventional mold underfill encapsulant materials between electrodes has been insufficient.

Thus, an object of the present invention is to provide a multi-layer sheet for mold underfill encapsulation having satisfactory infiltrability between electrodes.

Means for Solving Problem

The inventors conducted a thorough investigation on the above-described problems, and as a result, the inventors found that a multi-layer sheet comprising an (A)-layer formed from a resin composition having a specific tan δ (loss tangent) as an outermost layer can solve the above-described problems, thus completing the present invention.

That is, the present invention is the following multi-layer sheet.

The multi-layer sheet of the present invention for solving the above-described problems comprises an (A)-layer formed from a resin composition having a local maximum value of tan δ (loss tangent) of 3 or more at a measurement temperature of 125° C. for a measurement time of 0 to 100 seconds, as an outermost layer.

The tan δ (loss tangent) represents the proportion of the elastic properties and the viscous properties in a resin composition. In the case of carrying out underfilling for an electronic component such as a semiconductor chip where the distance between electrodes is narrower, just by having a low viscosity, a resin composition exhibits insufficient infiltrability into the deepest parts. In order to further satisfy the infiltrability into the deepest parts, elastic force, which is a force for pushing the infiltrated material from behind, is also required. The multi-layer sheet of the present invention, which contains an (A)-layer formed from a resin composition with a specified local maximum value of tan δ (loss tangent), can exhibit excellent infiltrability when performing mold underfill for an electronic component having a narrower distance between electrodes.

In addition, since the multi-layer sheet has a sheet shape, a step of injecting a resin that is liquid or the like is not needed in mold underfill encapsulation. Therefore, an electronic component mounting substrate having fewer voids can be produced, as compared with mold underfill encapsulation by a transfer molding method.

Furthermore, according to an embodiment of the multi-layer sheet of the present invention, the (A)-layer contains a filler, and the maximum particle size of the filler is 20 μm or less.

According to this feature, superior infiltrability can be exhibited for an electronic component having a narrower distance between electrodes.

Furthermore, according to an embodiment of the multi-layer sheet of the present invention, the (A)-layer contains a curing accelerator whose median diameter (D50) at a cumulative volume of 50% in the volume particle size distribution (hereinafter, referred to as "median diameter") is 10 μm or less.

With this feature, superior infiltrability can be exhibited for an electronic component having a narrower distance between electrodes.

Furthermore, according to an embodiment of the multi-layer sheet of the present invention, the thickness of the (A)-layer is 10 to 500 μm.

With this feature, warpage of an electronic component can be suppressed. Furthermore, a resin can easily infiltrate under the electronic component, and superior infiltrability can be exhibited.

Furthermore, according to an embodiment of the multi-layer sheet of the present invention, the multi-layer sheet comprises a (B)-layer formed from a resin composition that satisfies the following Formula (1).

In the following Formula (1), "α" represents the coefficient of thermal expansion α [ppm/K] at 80° C. or lower of a thermoset product obtained after subjecting the resin composition to a thermosetting treatment at 175° C. for one hour. "E'" represents the storage modulus E' [GPa] at 25° C. of the thermoset product.

$$40000 \leq \alpha \times E' \leq 250000 [Pa/K] \quad (1)$$

An electronic component may undergo a shape change due to heat at the time of resin curing; however, a multi-layer sheet comprising a (B)-layer formed from a resin composition that satisfies Formula (1) can conform to the shape change of the electronic component and can suppress warpage while exhibiting superior infiltrability.

Specifically, the coefficient of thermal expansion represents the proportion at which the length of the sheet changes in accordance with an increase in temperature, and the storage modulus represents the rigidity of the sheet. For example, with regard to the numerical value range of Formula (1), when the coefficient of thermal expansion α is large, the storage modulus E' becomes smaller, and the rigidity of the sheet can be made smaller. Then, the sheet can conform to a shape change of an electronic component, and the heat-induced stress of the electronic component can be relieved. As a result, warpage of the electronic component can be suppressed.

Furthermore, according to an embodiment of the multi-layer sheet of the present invention, the multi-layer sheet comprises a (B)-layer containing 70% by mass or more of a filler, and the ratio (B/A) of the thickness of the (B)-layer to the thickness of the (A)-layer is 1.0 to 80.

According to this feature, superior encapsulation performance can be exhibited for an electronic component with a narrower distance between electrodes, and at the same time, low warpage characteristics can be further exhibited for an encapsulated electronic component.

The method for mold underfill encapsulation of the present invention for solving the above-described problems is a method for mold underfill encapsulation of an electronic component mounting substrate, the method comprising a step of preparing a substrate on which an electronic component provided with electrodes having an electrode height (h) of 5 to 250 μm and a width (w) between electrodes of 5 to 500 μm is flip-chip mounted; a step of preparing a multi-layer sheet having an (A)-layer as an outermost layer; a step of placing the multi-layer sheet such that the (A)-layer comes into contact with the electronic component and the substrate; and a step of heating and compressing the placed multi-layer sheet.

Incidentally, the A-layer is a layer formed from a resin composition having a local maximum value of tan δ (loss tangent) of 3 or more at a measurement temperature of 125° C. for a measurement time of 0 to 100 seconds.

In the method for mold underfill encapsulation of the present invention, since a multi-layer film comprising the (A)-layer is used, the multi-layer film can be caused to infiltrate more efficiently between electrodes of an electronic component mounting substrate, and superior encapsulation method can be provided.

Furthermore, according to an embodiment of the method for mold underfill encapsulation of the present invention, the (A)-layer contains a filler, and the maximum particle size of the filler is equal to or less than the electrode height (h) and the width (w) between electrodes.

According to this feature, since the maximum particle size of the filler in the (A)-layer is equal to or less than the electrode height (h) and the width (w) between electrodes, a multi-layer film containing the (A)-layer can be caused to infiltrate more efficiently between electrodes on an electronic component mounting substrate, and warpage of the electronic component mounting substrate can be suppressed.

With regard to the electronic component mounting substrate of the present invention for solving the above-described problems, the mold underfill encapsulation is encapsulated by a multi-layer sheet comprising an (A)-layer as an outermost layer.

Incidentally, the A-layer is a layer formed from a resin composition having a local maximum value of tan δ (loss tangent) of 3 or more at a measurement temperature of 125° C. for a measurement time of 0 to 100 seconds.

According to this feature, since the multi-layer sheet comprising the (A)-layer is caused to infiltrate more efficiently between electrodes on an electronic component mounting substrate where electronic components are mounted, an electronic component mounting substrate having excellent heat resistance and moisture resistance can be provided.

A method for producing an electronic component mounting substrate of the present invention comprises a step of preparing a substrate on which an electronic component is flip-chip mounted; a step of preparing a multi-layer sheet having an (A)-layer as an outermost layer; a step of placing the multi-layer sheet such that the (A)-layer comes into contact with the electronic component and the substrate; and a step of heating and compressing the placed multi-layer sheet.

Incidentally, the A-layer is a layer formed from a resin composition having a local maximum value of tan δ (loss tangent) of 3 or more at a measurement temperature of 125° C. for a measurement time of 0 to 100 seconds.

According to this feature, since the multi-layer sheet comprising the (A)-layer can be caused to infiltrate more efficiently between electrodes of an electronic component mounting substrate, a method for producing an electronic component mounting substrate having excellent heat resistance and moisture resistance can be provided.

Effect of the Invention

According to the present invention, a multi-layer sheet for mold underfill encapsulation having satisfactory infiltrability between electrodes can be provided.

MODE(S) FOR CARRYING OUT THE INVENTION

Figure 1:
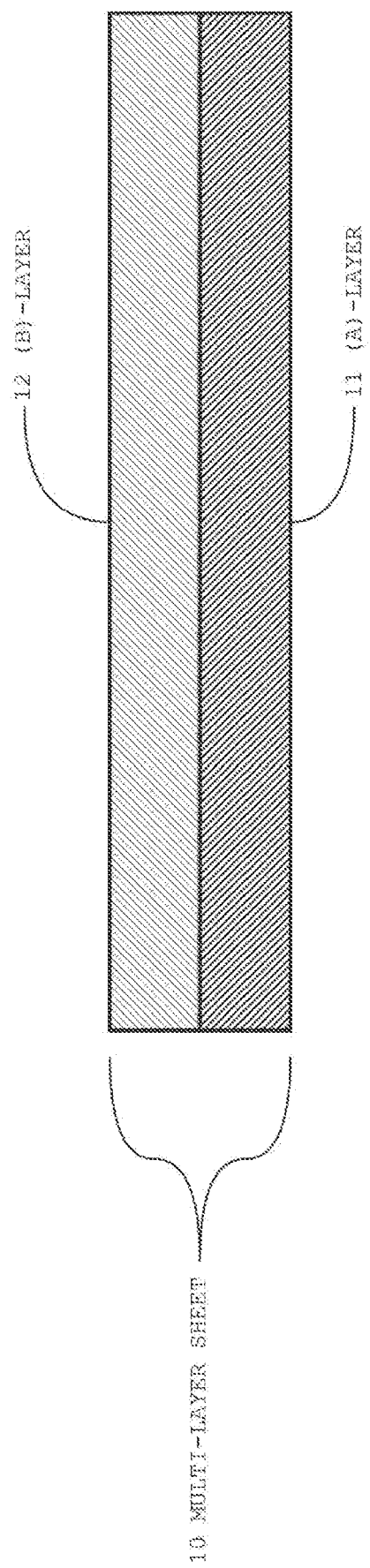
FIG. 1 is a schematic explanatory diagram of a multi-layer sheet of the present invention.

In the following description, suitable embodiments of the present invention will be described in detail. However, the present invention is not intended to be limited to the following embodiments.

[Multi-Layer Sheet for Mold Underfill Encapsulation]

The multi-layer sheet for mold underfill encapsulation of the present invention comprises an (A)-layer formed from a resin composition having a local maximum value of tan δ

(loss tangent) of 3 or more at a measurement temperature of 125° C. for a measurement time of 0 to 100 seconds, as an outermost layer.

Mold underfill encapsulation is one of methods for encapsulating electronic components and a substrate connected by flip-chip connection or the like and represents an encapsulation method of performing underfill encapsulation of performing encapsulation of electrode portions and overmold encapsulation of performing encapsulation of the entirety including electronic components, all at once.

<(A)-Layer>

The multi-layer sheet of the present invention comprises an (A)-layer formed from a resin composition having a local maximum value of tan δ (loss tangent) of 3 or more at a measurement temperature of 125° for a measurement time of 0 to 100 seconds, as an outermost layer.

The multi-layer film of the present invention comprising an (A)-layer formed from a resin composition having a specified local maximum value of tan δ (loss tangent) as an outermost layer can exhibit excellent infiltrability when performing mold underfilling for an electronic component having a narrower distance between electrodes.

Here, the outermost layer refers to a layer that is on the outermost side in a multi-layer sheet and refers to a layer that is in contact with, for example, the atmosphere such as air. In this case, a release film or a sheet is not referred to as outermost layer. Further, the (A)-layer of the present invention is a layer that is placed so as to come into direct contact with the electronic components and the substrate in the mold underfill encapsulation.

Furthermore, since the multi-layer sheet comprises the (A)-layer as the outermost layer, excellent encapsulation performance can be exhibited by placing the multi-layer sheet such that the (A)-layer comes into contact with the electronic components and the substrate and then performing encapsulation.

The local maximum value of tan δ (loss tangent) is preferably 5 or more, and more preferably 7 or more. There is no particular upper limit to the local maximum value of tan δ (loss tangent); however, the upper limit is preferably 60 or less, and more preferably 50 or less.

The local maximum value of tan δ of the resin composition that constitutes the (A)-layer can be controlled by the content of a filler or the type of a thermosetting resin or a curing agent. For example, when the content of the filler is increased, the local maximum value is decreased so that the local maximum value can be increased by reducing the content of the filler. Furthermore, by using a crystalline epoxy resin, a liquid epoxy resin, or the like, all of which have lower viscosity when heated, as a thermosetting resin, and by using a low-viscosity curing agent such as a low-molecular weight phenol, a crystalline acid anhydride, or liquid phenol, the local maximum value of tan δ can be adjusted to be 3 or more.

The local maximum value of tan δ of the resin composition constituting the (A)-layer according to the present invention is a value measured for a test specimen having a diameter of 25 mmΦ using a viscoelasticity measuring apparatus (for example, ARES-LS2 manufactured by TA Instruments, Inc.) under the conditions of a measurement temperature of 125° C., a measurement time of 0 to 100 seconds, and a frequency of 1 Hz.

In addition, the (A)-layer preferably contains a filler. The filler used for the (A)-layer is not particularly limited, and examples include silica such as fused silica or crystalline silica, alumina, talc, calcium carbonate, titanium white, red iron oxide, silicon carbide, boron nitride (BN), and glass beads. These may be used singly, or two or more kinds thereof may be used in combination.

From the viewpoint of enhancing infiltrability between electrodes, it is preferable to use a silica powder, and it is more preferable to use a fused silica powder among silica powders. Examples of the fused silica powder include a spherical fused silica powder and a crushed fused silica powder; however, from the viewpoint of fluidity, it is particularly preferable to use a spherical fused silica powder, and a spherical fused silica powder with a higher degree of sphericity is more preferred.

Furthermore, by containing a filler, warpage of an electronic component can be suppressed.

In addition, regarding the filler, a filler having its surface reacted in advance with a silane coupling agent can also be used. By using a filler having its surface reacted with a silane coupling agent, dispersibility in a resin composition can be enhanced. The mixing amount in the case of using a silane coupling agent is preferably 0.05 to 5 parts by mass, and more preferably 0.1 to 3 parts by mass, with respect to 100 parts by mass of the filler.

In the (A)-layer, the content of the filler is preferably 30% by mass or more. The lower limit value is more preferably 73% by mass or more, and even more preferably 76% by mass or more. The upper limit value is more preferably 93% by mass or less, and even more preferably 85% by mass or less. By adjusting the content of the filler to be in the above-described range, the local maximum value of tan δ (loss tangent) can be adjusted to be 3 or more. Incidentally, when the content of the filler is 30% or more, processability of the resin composition tends to be enhanced.

The median diameter of the filler is, for example, preferably 0.1 to 30 μm. The lower limit value is more preferably 0.1 μm or more, and even more preferably 0.5 μm or more. The upper limit value is more preferably 20 μm or less, and even more preferably 10 μm or less.

Furthermore, in the (A)-layer, the maximum particle size of the filler is smaller than, for example, the electrode height or the width of an electrode, and the maximum particle size is preferably 20 μm or less. The upper limit value is more preferably 15 μm or less, and even more preferably 10 μm or less.

When the maximum particle size of the filler in the (A)-layer is adjusted to 20 μm or less, infiltrability between electrodes can be further enhanced.

Incidentally, the median diameter and the maximum particle size are values that can be derived by making measurement using, for example, a sample arbitrarily extracted from a population and using a laser diffraction scattering type particle size distribution analyzer.

In addition, the material constituting the (A)-layer is not particularly limited; however, the material is preferably a resin, and more preferably a thermosetting resin.

Examples of the thermosetting resin include an epoxy resin, a (meth)acrylic resin, a phenol resin, a melamine resin, a silicone resin, a urea resin, a urethane resin, a vinyl ester resin, an unsaturated polyester resin, a diallyl phthalate resin, and a polyimide resin. These may be used singly, or two or more kinds thereof may be used in combination. In order to control the local maximum value of tan δ of the resin composition constituting the (A)-layer to be 3 or more, an epoxy resin is preferred above all, and an epoxy resin having low viscosity when heated, for example, a crystalline epoxy resin such as a naphthalene type epoxy resin, and a liquid epoxy resin such as a liquid bisphenol A type epoxy resin are more preferred.

The epoxy resin is not particularly limited; however, examples include bisphenol type epoxy resins such as a bisphenol A type epoxy resin, a bisphenol F type epoxy resin, a bisphenol AD type epoxy resin, a hydrogenated bisphenol A type epoxy resin, a hydrogenated bisphenol F type epoxy resin, a biphenyl type or tetramethylbiphenyl type epoxy resin, a phenol novolac type epoxy resin, a naphthalene type epoxy resin, and alicyclic aliphatic epoxy resins such as a dicyclopentadiene type epoxy resin; glycidylamine type epoxy resins, and glycidyl ethers of organic carboxylic acids. These may be used singly, or two or more kinds thereof may be used in combination. The epoxy resin may be a prepolymer or may be a copolymer with another polymer, such as a polyether-modified type epoxy resin or a silicone-modified type epoxy resin. Above all, preferred examples include a bisphenol type epoxy resin, a biphenyl type epoxy resin, a dicyclopentadiene type epoxy resin, a glycidylamine type epoxy resin, a naphthalene type epoxy resin, and a polyether-modified type epoxy resin.

The epoxy resin can include about 0.1% to 30% by mass of a monofunctional epoxy resin having one epoxy resin in the molecule with respect to the total amount of epoxy resins, for the purpose of regulating the viscosity of the resin composition. As such a monofunctional epoxy resin, phenyl glycidyl ether, 2-ethylhexyl glycidyl ether, ethyl diethylene glycol glycidyl ether, dicyclopentadiene glycidyl ether, 2-hydroxyethyl glycidyl ether, or the like can be used. These may be used singly, or two or more kinds thereof may be used in combination.

In the (A)-layer, the content of the thermosetting resin is not particularly limited; however, the content is preferably 5% to 50% by mass.

Furthermore, in the (A)-layer, the content of the epoxy resin is not particularly limited; however, the content is from 5% by mass to 50% by mass. The lower limit value is preferably 5% by mass or more, and more preferably 10% by mass or more. The upper limit value is preferably 40% by mass or less, or more preferably 30% by mass or less.

In addition, the (A)-layer may include a curing agent for the thermosetting resin, and although the type of the curing agent is not particularly limited, examples include a phenol-based curing agent such as solid phenol, solid phenol novolac, or liquid phenol novolac; a dicyandiamide-based curing agent (dicyandiamide or the like); a urea-based curing agent; an organic acid hydrazide-based curing agent; a polyamine salt-based curing agent; an amine adduct-based curing agent; an acid anhydride-based curing agent such as a solid acid anhydride or a liquid acid anhydride; and an imidazole-based curing agent. In order to control the local maximum value of tan δ of the (A)-layer to be 3 or more, it is preferable to use a low-viscosity curing agent such as liquid phenol novolac or a liquid acid anhydride. These may be used singly, or two or more kinds thereof may be used in combination. The type of the curing agent can be appropriately selected in accordance with the thermosetting resin.

The amount of the curing agent varies depending on the type of the curing agent. In the case of using an epoxy resin, for example, it is preferable to use a curing agent in an amount such that the equivalent number of functional groups of the curing agent is 0.001 to 2 equivalents, and more preferably 0.005 to 1.5 equivalents, per 1 equivalent of the epoxy group.

Furthermore, it is preferable that the (A)-layer contains a curing accelerator. Examples of the curing accelerator include an amine compound such as an imidazole compound, a phosphorus compound and basic compounds such as an organometallic compound, and a microcapsule type curing accelerator.

Examples of the imidazole compound include imidazole; 2-methylimidazole, 2-ethylimidazole, 2-substituted imidazole compounds such as 1-isobutyl-2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, and 1-cyanoethyl-2-phenylimidazole; trimellitic acid salts such as 1-cyanoethyl-2-undecylimidazolium trimellitate and 1-cyanoethyl-2-phenylimidazolium trimellitate; triazine adducts such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine; 2,4-diamino-6-[2'-methylimidazolyl-(1')]-ethyl-s-triazine isocyanuric acid adduct, 2-phenylimidazole isocyanuric acid adduct, 2-methylimidazole isocyanuric acid adduct, 2-phenyl-4,5-dihydroxymethylimidazole, and 2-phenyl-4-methyl-5-dihydroxymethylimidazole.

Examples of the phosphorus compound include trialkylphosphine-based compounds such as tributylphosphine; and triarylphosphine-based compounds such as triphenylphosphine.

Examples of the amine compound also include 2,4,6-tris(dimethylaminomethyl)phenol, diethylamine, triethylamine, diethylenetetramine, triethylenetetramine, and 4,4-dimethylaminopyridine. The amine compound may be an amine adduct.

Examples of the organometallic compound include zinc naphthenate, cobalt naphthenate, tin octylate, cobalt octylate, bis(acetylacetonato)cobalt(II), and tris(acetylacetonato) cobalt(III).

As the microcapsule type curing accelerator, for example, a microparticle composition in which an amine-based compound powder is dispersed in an epoxy resin, or the like can be used. The amine-based compound may be selected from those that will be listed below as examples, based on the desired thickening factor. Examples of the amine-based compound include an aliphatic primary amine, an alicyclic primary amine, an aromatic primary amine, an aliphatic secondary amine, an alicyclic secondary amine, an aromatic secondary amine, an imidazole compound, an imidazoline compound, and reaction products of these compounds with carboxylic acids, sulfonic acids, isocyanates, epoxies, and the like. These can be used singly or in combination of two or more kinds thereof, and for example, combinations of an aliphatic primary amine, an alicyclic primary amine, an aromatic primary amine, an aliphatic secondary amine, an alicyclic secondary amine, an aromatic secondary amine, an imidazole compound, or an imidazoline compound with a reaction product thereof with a carboxylic acid, a sulfonic acid, an isocyanate, or an epoxy can be preferably used. Furthermore, it is preferable that the amine-based compound powder has a melting point or a softening point of 60° C. or higher, from the viewpoint of suppressing thickening at 25° C.

In addition, the curing accelerator contained in the (A)-layer is preferably such that the median diameter is 10 μm or less. By containing a curing accelerator having a median diameter of 10 μm or less, superior infiltrability can be exhibited for an electronic component having a narrower distance between electrodes. That is, since particles having a large particle size are not included, defective infiltration between narrow electrodes can be suppressed. Furthermore, since the median diameter is small, large particles and smaller particles are not separated within the system, and therefore, defective partial curing after infiltration can be suppressed.

The upper limit value of the median diameter of the curing accelerator is more preferably 5 µm or less, and more preferably 3 µm or less. The lower limit value is preferably 0.1 µm or more.

In the (A)-layer, the content of the curing accelerator is, for example, from 0.1 parts by mass to 40 parts by mass with respect to 100 parts by mass of the thermosetting resin. The lower limit value is preferably 1 part by mass or more, and more preferably 5 parts by mass or more. The upper limit value is preferably 30 parts by mass or less, and more preferably 20 parts by mass or less. By including the curing accelerator at the above-described content, warpage can be suppressed while suppressing the occurrence of defective curing.

In addition, in a case where an epoxy resin is used in the (A)-layer, the content of the curing accelerator is, for example, from 0.1 parts by mass to 40 parts by mass with respect to 100 parts by mass of the epoxy resin. The lower limit value is preferably 1 part by mass or more, and more preferably 5 parts by mass or more. The upper limit value is preferably 30 parts by mass or less, and more preferably 20 parts by mass or less. By including the curing accelerator at the above-described content, warpage can be suppressed while suppressing the occurrence of defective curing.

In the (A)-layer of the present invention, other additives can be used as long as the purpose of the present invention is not impaired. Examples of such additives include a thermoplastic resin, a silane coupling agent, carbon black, and an ion scavenger.

Examples of the thermoplastic resin include silicone oils such as a non-reactive silicone oil and a reactive silicone oil, an acrylic resin, a phenoxy resin, a polyolefin, a polyurethane, a blocked isocyanate, a polyether, a polyester, a polyimide, a polyvinyl alcohol, a butyral resin, a polyamide, vinyl chloride, cellulose, a thermoplastic epoxy resin, and a thermoplastic phenol resin.

Examples of the non-reactive silicone oil include a polysiloxane, a polyether-modified silicone oil, and an alkyl-modified silicone oil. Examples of the reactive silicone oil include an epoxy-modified silicone oil, a carboxyl-modified silicone oil, and an amino-modified silicone oil.

Examples of the silane coupling agent include 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, and vinyltriethoxysilane. The above-described silane coupling agents can be appropriately incorporated even in the case of using a silica having its surface reacted in advance with a silane coupling agent.

The content of the silane coupling agent is preferably 0.1% to 10% by mass, and more preferably 2% to 6% by mass, in the (A)-layer.

The content of the carbon black is preferably 0.1% to 5% by mass, and more preferably 0.5% to 3% by mass, in the (A)-layer.

The ion scavenger is an agent having an ability to scavenge impurity ions in the encapsulating composition and is desirably an agent that can enhance reliability of an encapsulated electronic component. Examples of the ion scavenger include an inorganic ion exchanger.

The content in the case of containing an ion scavenger is not particularly limited; however, the content is preferably 0.05% by mass or more, and more preferably 3% by mass or less, in the (A)-layer.

Furthermore, the thickness of the (A)-layer in the multi-layer sheet of the present invention is preferably 10 to 500 µm. The lower limit value is more preferably 20 µm or more, and even more preferably 40 µm or more. The upper limit value is more preferably 400 µm or less, and even more preferably 300 µm or less.

By adjusting the thickness of the (A)-layer to be in the above-described range, warpage of an electronic component can be suppressed. Furthermore, the resin can easily infiltrate under an electronic component, and superior infiltrability can be exhibited.

<(B)-Layer>

The multi-layer sheet of the present invention can preferably comprise a (B)-layer in addition to the (A)-layer. As the multi-layer sheet of the present invention comprises the (B)-layer, the occurrence of warpage in the multi-layer sheet can be suppressed. In the multi-layer sheet of the present invention, the (B)-layer is preferably an outermost layer on the opposite surface of the (A)-layer, or an intermediate layer. Furthermore, even in this case, a release film or a sheet is not considered to be the outermost layer.

Furthermore, the multi-layer sheet of the present invention is such that even if the (B)-layer is an outermost layer, the (B)-layer does not have to be placed so as to come into direct contact with the electronic components and the substrate in the mold underfill encapsulation.

The (B)-layer is preferably a layer containing a filler. The type of the filler is not particularly limited; however, fillers similar to those described in the section for the (A)-layer can be used.

In the (B)-layer, the content of the filler is preferably 70% by mass or more. The lower limit value is more preferably 75% by mass or more, and even more preferably 80% by mass or more. The upper limit value is preferably 93% by mass or less, and more preferably 90% by mass or less. By adjusting the content of the filler to be in the above-described range, warpage of an encapsulated electronic component can be suppressed.

The median diameter of the filler is preferably 0.1 to 30 µm. The lower limit value is more preferably 1 µm or more, and even more preferably 3 µm or more. The upper limit value is more preferably 20 µm or less, and even more preferably 15 µm or less.

The coefficient of thermal expansion of the filler is not particularly limited; however, the coefficient of thermal expansion is preferably 1 ppm/K or more, and more preferably 2 ppm/K or more. The upper limit value is preferably 15 ppm/K or less, and more preferably 10 ppm/K or less.

By using a filler having a coefficient of thermal expansion in the above-described range as the filler, the coefficient of thermal expansion of the (B)-layer at 80° C. or lower can be controlled.

In addition, the material constituting the (B)-layer is not particularly limited; however, the material is preferably a resin, and more preferably a thermosetting resin. Regarding the thermosetting resin, a resin similar to those described in the section for the (A)-layer can be used, and the thermosetting resin is preferably an epoxy resin.

The epoxy resin is not particularly limited, and examples include bisphenol type epoxy resins such as a bisphenol A type epoxy resin, a bisphenol F type epoxy resin, a bisphenol AD type epoxy resin, a hydrogenated bisphenol A type epoxy resin, a hydrogenated bisphenol F type epoxy resin, and a bisphenol-modified type epoxy resin; a biphenyl type or tetramethylbiphenyl type epoxy resin, a phenol novolac type epoxy resin, a naphthalene type epoxy resin, an alicyclic aliphatic epoxy resin, a phenolphthalein type epoxy resin, and a glycidyl ether of an organic carboxylic acid. These may be used singly, or two or more kinds thereof may be used in combination. The epoxy resin may be a prepolymer or may be a copolymer with a polymer other than an epoxy resin, such as a polyether-modified type epoxy resin or a silicone-modified type epoxy resin. Above all, by using a biphenyl type epoxy resin, a phenol novolac type epoxy resin, a phenolphthalein type epoxy resin, or a bisphenol-modified type epoxy resin, all of which are epoxy resins having a rigid skeleton, the coefficient of thermal expansion of the (B)-layer at 80° C. or lower can be reduced. Furthermore, the storage modulus E' at 25° C. of the (B)-layer can be reduced by using a polyether-modified type epoxy resin or the like having a flexible skeleton.

The epoxy resin can include about 0.1% to 30% by mass of a monofunctional epoxy resin having one epoxy group in the molecule with respect to the total amount of the epoxy resin, for the purpose of regulating the viscosity of the resin composition. As such a monofunctional epoxy resin, phenyl glycidyl ether, 2-ethylhexyl glycidyl ether, ethyl diethylene glycol glycidyl ether, dicyclopentadiene glycidyl ether, 2-hydroxyethyl glycidyl ether, or the like can be used. These may be used singly, or two or more kinds thereof may be used in combination.

In the (B)-layer, the content of the thermosetting resin is not particularly limited; however, the content is preferably 2% to 30% by mass.

Furthermore, in the (B)-layer, the content of the epoxy resin is not particularly limited; however, the content is from 2% by mass to 30% by mass. The lower limit value is preferably 3% by mass or more, and more preferably 5% by mass or more. The upper limit value is preferably 25% by mass or less, and more preferably 20% by mass or less.

In addition, the (B)-layer may include a curing agent and a curing accelerator for the thermosetting resin, and regarding the types of the curing agent and the curing accelerator, the same ones as those described in the section for the (A)-layer can be used.

The amount of the curing agent varies depending on the type of the curing agent. In the case of using an epoxy resin, for example, it is preferable to use a curing agent in an amount such that the equivalent number of functional groups of the curing agent is 0.001 to 2 equivalents, and more preferably 0.005 to 1.5 equivalents, per 1 equivalent of the epoxy group. Above all, the storage modulus of the (B)-layer can be reduced by using a phenol-based curing agent such as a solid phenol novolac resin, and preferably a biphenyl type phenol novolac resin.

The content of the curing accelerator in the (B)-layer is preferably from 0.1 parts by mass to 40 parts by mass with respect to 100 parts by mass of the thermosetting resin. The lower limit value is more preferably 1 part by mass or more, and even more preferably 5 parts by mass or more. The upper limit value is more preferably 30 parts by mass or less, and even more preferably 20 parts by mass or less. By including the curing accelerator at the above-described content, warpage can be suppressed while suppressing the occurrence of defective curing.

In addition, in the case of using an epoxy resin in the (B)-layer, the content of the curing accelerator is preferably from 0.1 parts by mass to 40 parts by mass with respect to 100 parts by mass of the epoxy resin. The lower limit value is more preferably 1 part by mass or more, and even more preferably 5 parts by mass or more. The upper limit value is more preferably 30 parts by mass or less, and even more preferably 20 parts by mass or less. By including the curing accelerator at the above-described content, warpage can be suppressed while suppressing the occurrence of defective curing.

In the (B)-layer, other additives can be used as long as the purpose of the present invention is not impaired. Regarding such additives, the same additives as those described in the section for the (A)-layer can be used, and examples include a thermoplastic resin, a silane coupling agent, carbon back, and an ion scavenger.

Examples of the thermoplastic resin include silicone oils such as a non-reactive silicone oil and a reactive silicone oil, an acrylic resin, a phenoxy resin, a polyolefin, a polyurethane, a blocked isocyanate, a polyether, a polyester, a polyimide, a polyvinyl alcohol, a butyral resin, a polyamide, vinyl chloride, cellulose, a thermoplastic epoxy resin, and a thermoplastic phenol resin. Above all, by using a resin such as a polyester, an acrylic resin, a silicone oil, a polyether, a polyvinyl alcohol, or a polyamide, the storage modulus of the (B)-layer can be made small.

Examples of the silane coupling agent include 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, and vinyltriethoxysilane. The above-described silane coupling agents can be appropriately incorporated even in the case of using a silica having its surface reacted in advance with a silane coupling agent.

The content of the silane coupling agent is preferably 0.1% to 10% by mass, and more preferably 2% to 6% by mass, in the (B)-layer.

The content of the carbon black is preferably 0.1% to 5% by mass, and more preferably 0.5% to 3% by mass, in the (B)-layer.

The ion scavenger is an agent having an ability to scavenge impurity ions in the encapsulating composition and is desirably an agent that can enhance reliability of an encapsulated electronic component. Examples of the ion scavenger include an inorganic ion exchanger.

The content in the case of containing an ion scavenger is not particularly limited; however, the content is preferably 0.05% by mass or more, and more preferably 3% by mass or less, in the (B)-layer.

Furthermore, the thickness of the (B)-layer in the multi-layer sheet of the present invention is preferably 50 to 800 μm. The lower limit value is more preferably 100 μm or more, and even more preferably 200 μm or more. The upper limit value is more preferably 700 μm or less, and even more preferably 600 μm or less.

By adjusting the thickness of the (B)-layer to be in the above-described range, warpage of an electronic component can be suppressed.

Furthermore, it is preferable that the (B)-layer of the multi-layer sheet of the present invention comprises a (B)-layer formed from a resin composition in which the coefficient of thermal expansion α [ppm/K] at 80° C. or lower and the storage modulus E' [GPa] at 25° C. of the thermoset product satisfy the following Formula (1).

$$40000 \leq \alpha \times E' \leq 250000 [Pa/K] \qquad (1)$$

The lower limit value of α×E' of the (B)-layer is more preferably 40000 or more, and even more preferably 50000 or more. The upper limit value is more preferably 220000 or less, and even more preferably 180000 or less.

The multi-layer sheet of the present invention can relieve heat-induced stress at the time of curing by comprising a (B)-layer formed from a resin composition that satisfies the above-described Formula (1), warpage of an electronic component can be suppressed.

The lower limit value of the coefficient of thermal expansion α at 80° C. or lower of the resin composition constituting the (B)-layer is preferably 3 ppm/K or higher, and more preferably 5 ppm/K or higher. The upper limit value is preferably 15 ppm/K or lower, and more preferably 10 ppm/K or lower.

By adjusting the coefficient of thermal expansion α to be in the above-described range, the sheet can conform to a shape change of an electronic component.

The coefficient of thermal expansion of the resin composition constituting the (B)-layer can be controlled by the coefficient of thermal expansion of the filler to be added, the amount of addition of the filler, the chemical structure of the thermosetting resin, and the glass transition temperature. For example, the coefficient of thermal expansion can be made small by charging a filler having a small coefficient of thermal expansion to a high level or by using an epoxy resin or the like having a rigid skeleton. In addition, the coefficient of thermal expansion at a temperature equal to or lower than the glass transition temperature can be lowered by increasing the glass transition temperature of the (B)-layer.

Regarding a method for measuring the coefficient of thermal expansion α, a resin sheet composed only of the (B)-layer is subjected to a thermosetting treatment at 150° C. for one hour, and then a measurement sample having a size of 20 mm in length×5 mm in width×5 μm in thickness is prepared from the thermoset product. The measurement sample is placed on a jig for compression measurement of a thermomechanical analyzer (TMA7100), and then the coefficient of thermal expansion α in the temperature range of −50° C. to 300° C. is calculated from the expansion rate at 50° C. to 70° C. under the conditions of a load of 5 g and a rate of temperature increase of 2.5° C./min.

The lower limit value of the storage modulus E' at 25° C. of the resin composition constituting the (B)-layer is preferably 3 GPa or higher, and more preferably 10 GPa or higher. The upper limit value is preferably 50 GPa or lower, and more preferably 30 GPa or lower.

By adjusting the storage modulus E' to be in the above-described range, a shape change of an electronic component can be suppressed by the rigidity of the sheet, and as a result, warpage of the electronic component can be suppressed.

The storage modulus of the resin composition constituting the (B)-layer can be controlled by the amount of addition of the filler, the skeletons of the thermosetting resin and the curing agent, and the type of the thermoplastic resin. For example, the storage modulus can be made small by increasing the amount of addition of the filler, by using an epoxy resin, a biphenyl type phenol novolac resin, or the like, all of which have a skeleton with flexibility, such as a polyether structure, or by incorporating a thermoplastic resin such as an acrylic resin.

The method for measuring the storage modulus E' is carried out by the following procedure.

(1) A resin sheet composed only of the (B)-layer is subjected to a thermosetting treatment at 150° C. for one hour, and then a measurement sample having a size of 50 mm in length×10 mm in width×2 mm in thickness is prepared from the thermoset product.

(2) The measurement sample is placed on a jig for flexural measurement, and the flexural storage modulus in the temperature range of −50° C. to 300° C. is measured using a viscoelasticity analyzer (DMA6100, manufactured by Hitachi High-Tech Science Corporation) under the conditions of a frequency of 1 Hz and a rate of temperature increase of 2.5° C./min.

(3) The Storage Modulus (E') at 25° C. is Read Out from the Measurement Results.

Furthermore, the resin composition that constitutes the (B)-layer of the multi-layer sheet of the present invention is preferably such that the glass transition temperature of the thermoset product obtained by subjecting the resin composition to a thermosetting treatment at 175° C. for one hour is 80° C. or higher. Since the glass transition temperature of the thermoset product after the thermosetting treatment at 175° C. for one hour is 80° C. or higher, an encapsulation product encapsulated with the multi-layer sheet can have excellent thermal stability.

In order to adjust the glass transition temperature of the thermoset product of the (B)-layer to be 80° C. or higher, the rigidity of the thermoset product may be enhanced, and for example, it is preferable to increase the content of epoxy groups in the epoxy resin or to increase the number of reactive groups in the curing agent.

Furthermore, the thickness of the entirety of the multi-layer sheet of the present invention is not particularly limited; however, the thickness is preferably 100 μm or more. The lower limit value is more preferably 150 μm or more, and even more preferably 200 μm or more. The upper limit value is more preferably 1000 μm or less, and even more preferably 800 μm or less.

By adjusting the thickness of the (B)-layer to be in the above-described range, warpage of an electronic component can be suppressed.

Furthermore, with regard to the multi-layer sheet of the present invention, the ratio (B/A) of the thickness of the (B)-layer to the thickness of the (A)-layer is preferably 1.0 to 80, and more preferably 2.0 to 10.

By adjusting the ratio of the thickness of the (A)-layer and the thickness of the (B)-layer to be in the above-described range, the multi-layer sheet can exhibit superior encapsulation performance for an electronic component having a narrower distance between electrodes, and at the same time, low warpage characteristics can be further exhibited for an encapsulated electronic component.

The multi-layer sheet of the present invention may also comprise another layer in addition to the (A)-layer and the (B)-layer. The other layer preferably includes the thermosetting resin described in the sections for the (A)-layer and the (B)-layer and may also contain a filler and the like.

Furthermore, the other layer may be a single layer or may be a larger number of layers.

When the multi-layer sheet of the present invention includes another layer, for example, when the other layer is referred to as a (C)-layer, a configuration of (A)-layer/(C)-layer/(B)-layer or a configuration of (A)-layer/(B)-layer/(C)-layer can be adopted.

Furthermore, the multi-layer sheet of the present invention is preferably such that the local maximum value of tan δ (loss tangent) of the resin composition constituting the (A)-layer at a measurement temperature of 125° C. for a measurement time of 0 to 100 seconds is equal to or less than the local maximum value of tan δ (loss tangent) of the resin composition constituting a layer other than the (A)-layer at a measurement temperature of 125° C. for a measurement time of 0 to 100 seconds.

For example, in the case of a two-layer sheet composed of an (A)-layer and a (B)-layer, and in the case of a three-phase sheet composed of (A)-layer/(C)-layer/(B)-layer, by adjusting the local maximum value of tan δ of the resin composition constituting the (A)-layer to be equal to or less than the local maximum value of tan δ of the resin composition constituting the (B)-layer, the (A)-layer and the (B)-layer can be prevented from melting and then mixing, and underfill and overmold encapsulation can be efficiently carried out.

Furthermore, for example, in the case of adopting the configuration of (A)-layer/(B)-layer/(C)-layer, it is preferable that the local maximum value of tan δ (loss tangent) of the resin composition constituting the (A)-layer at a measurement temperature of 125° C. for a measurement time of 0 to 100 seconds is made equal to or less than the local maximum value of tan δ (loss tangent) of the (C)-layer at a measurement temperature of 125° C. for a measurement time of 0 to 100 seconds.

By making the local maximum value of tan δ (loss tangent) of the resin composition constituting the (A)-layer at a measurement temperature of 125° C. for a measurement time of 0 to 100 seconds to be equal to or less than the local maximum value of tan δ (loss tangent) of a layer other than the (A)-layer at a measurement temperature of 125° C. for a measurement time of 0 to 100 seconds, the (A)-layer and the layer other than the (A)-layer can be prevented from melting and then mixing, and underfill and overmold encapsulation can be efficiently carried out.

A schematic explanatory diagram of the multi-layer sheet of the present invention is shown in FIG. 1. The multi-layer sheet shown in FIG. 1 is a multi-layer sheet having two layers consisting of an (A)-layer 11 and a (B)-layer 12.

The multi-layer sheet shown in FIG. 1 is a sheet comprising the (A)-layer 11 and the (B)-layer 12 as the outermost layers, respectively; however, the multi-layer sheet can also be produced into a multi-layer sheet comprising another layer in addition to the (A)-layer and the (B)-layer as described above.

[Method for Producing Multi-Layer Sheet]

In the method for producing a multi-layer sheet of the present invention, a multi-layer sheet may be produced by individually forming each of the layers by, for example, a calender film-forming method, a casting film-forming method, an inflation extrusion method, a T-die extrusion method, a dry lamination method, or the like, and subsequently sticking the layers together, or by using a co-extrusion method or the like.

Furthermore, a multi-layer sheet can be formed on a base material, and at the time of use, the multi-layer sheet can be used after peeling off the base material.

The base material is not particularly limited; however, examples include a plastic film, paper, a nonwoven fabric, and a metal. Examples of the plastic film include a polyolefin-based film, a vinyl halide polymer-based film, an acrylic resin-based film, a rubber-based film, a cellulose-based film, a polyester-based film, a polycarbonate-based film, a polystyrene-based film, a polyphenylene sulfide-based film, and a cycloolefin polymer-based film. Furthermore, a base material that has been release-treated with silicone or the like can also be used.

The thickness of the base material is not particularly limited; however, the thickness is preferably 500 μm or less.

[Method for Mold Underfill Encapsulation of Electronic Component Mounting Substrate]

Next, a method for mold underfill encapsulation method of an electronic component mounting substrate will be described.

The method for mold underfill encapsulation of an electronic component mounting substrate of the present invention comprises a step of preparing a substrate on which an electronic component provided with electrodes having an electrode height (h) of 5 to 250 μm and a width (w) between electrodes of 5 to 500 μm is flip-chip mounted; a step of preparing a multi-layer sheet having an (A)-layer as an outermost layer, the (A)-layer having a local maximum value of tan δ (loss tangent) of 3 or more at a measurement temperature of 125° C. for a measurement time of 0 to 100 seconds; a step of placing the multi-layer sheet such that the (A)-layer comes into contact with the electronic component and the substrate; and a step of heating and compressing the placed multi-layer sheet.

Examples of the electronic component include semiconductor chips such as an integrated circuit (IC) in which transistors, capacitors, resistors, and the like are integrated on a single chip, and a large-scale integrated circuit (LSI) in which the degree of integration of IC is further increased, and 1000 or more elements are housed in a single chip.

Furthermore, the shape of the electrode is not particularly limited, and examples include a ball, a pillar, a post, and a column. The material of the electrode is not particularly limited, and examples include Sn—Pb-based, Pb—Sn—Sb-based, Sn—Sb-based, Sn—Pb—Bi-based, lead-free Sn—Ag-based, Sn—Ag—Cu-based, Bi—Sn-based, Sn—Cu-based, Sn—Ag—Bi—In-based, SN—Zn—Bi-based solders; gold-based metal materials, copper-based metal materials, and copper-based alloys. Furthermore, the electrode height (h) is 5 to 250 μm, and the width (w) between the electrodes is 5 to 500 μm.

Examples of the substrate include a printed wiring board having a circuit printed thereon.

Next, the method for mold underfill encapsulation will be described using FIGS. 2 to 4.

Figure 2:
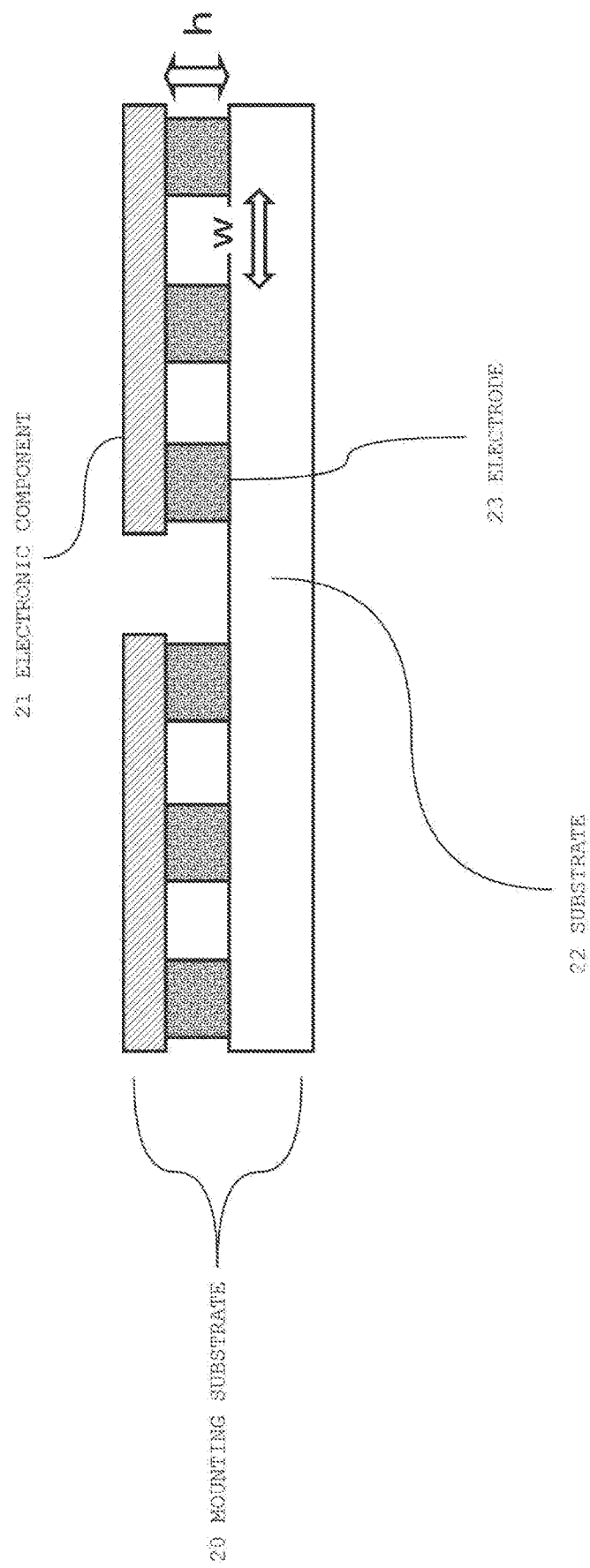
FIG. 2 is a schematic explanatory diagram of an electronic component mounting substrate.

FIG. 2 is a schematic explanatory diagram of an electronic component mounting substrate (mounting substrate) 20 on which electronic components 21 and a substrate 22 are connected by electrodes 23. The electronic components 21 and the substrate 22 are conducted by the electrodes 23. At this time, the height (h) between electrodes is 5 to 250 μm, and the width (w) is 5 to 500 μm. Furthermore, the diameter of the electrodes is preferably 10 μm to 1000 μm.

Figure 3:
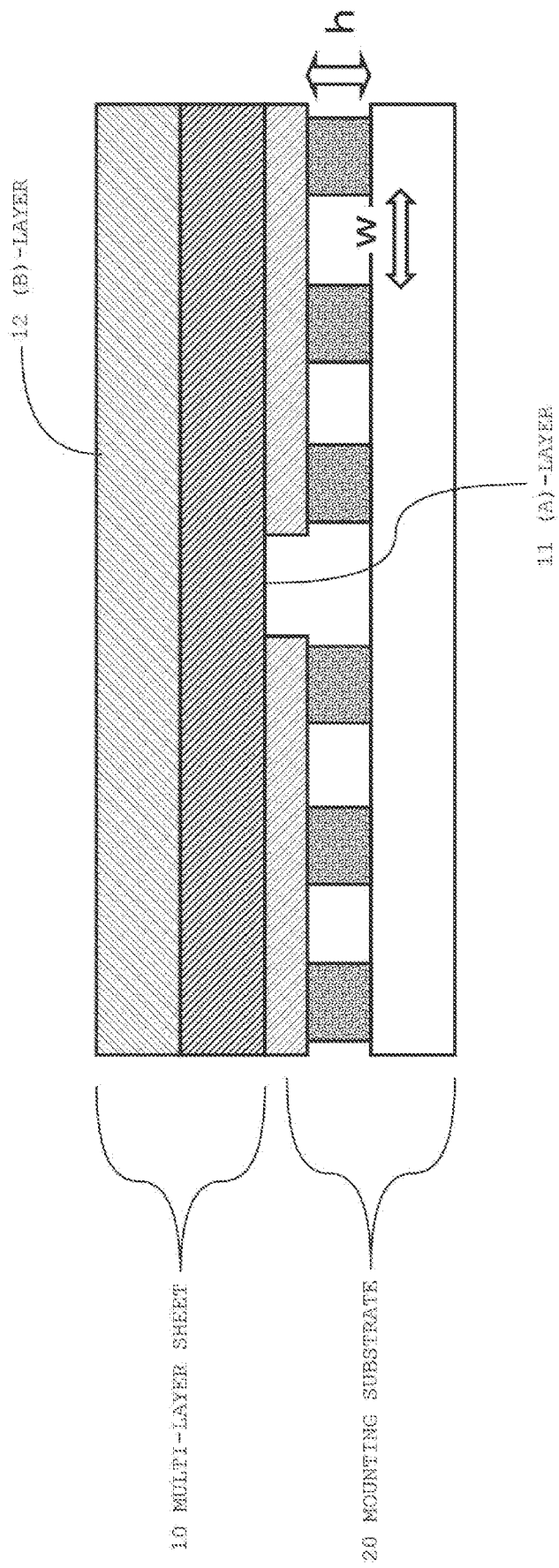
FIG. 3 is a schematic explanatory diagram of a state in which the multi-layer sheet of the present invention is placed on the electronic component mounting substrate.

FIG. 3 is a schematic explanatory diagram of a state in which a multi-layer sheet 10 is placed on the electronic component mounting substrate (mounting substrate) 20 such that an (A)-layer comes into contact with the electronic component 21 and the substrate 22.

At this time, the maximum particle size of the filler included in the multi-layer film is preferably equal to or less than the height (h) and width (w) between the electrodes.

Next, the electronic component mounting substrate can be subjected to mold underfill encapsulation by heating and compressing the multi-layer sheet 10.

The heating temperature at this time is not particularly limited; however, the heating temperature is preferably 70° C. to 150° C. The lower limit value is more preferably 80° C. or higher, and even more preferably 90° C. or higher. The upper limit value is more preferably 140° C. or lower, and even more preferably 130° C. or lower.

The compression pressure is not particularly limited; however, the pressure is preferably 0.5 to 10 MPa. The lower limit value is more preferably 1 MPa or higher, and even more preferably 1.5 MPa or higher. The upper limit value is more preferably 8 MPa or lower, and even more preferably 6 MPa or lower.

Furthermore, the method for heating and compression is not particularly limited; however, a method of pressing the multi-layer sheet while heating, by means of a press plate or the like may be mentioned. Furthermore, at the time of heating and compression, heating and compression can be achieved under reduced pressure conditions.

Furthermore, in a case where a thermosetting resin is contained as a material of the multi-layer film, it is preferable to provide a post-curing step. The post-curing step is a step of curing by heating.

The heating temperature is preferably 90° C. to 200° C. The lower limit value is more preferably 120° C. or higher, and even more preferably 140° C. or higher. In addition, the heating time is preferably 30 to 240 minutes, and more preferably 60 to 180 minutes.

Figure 4:
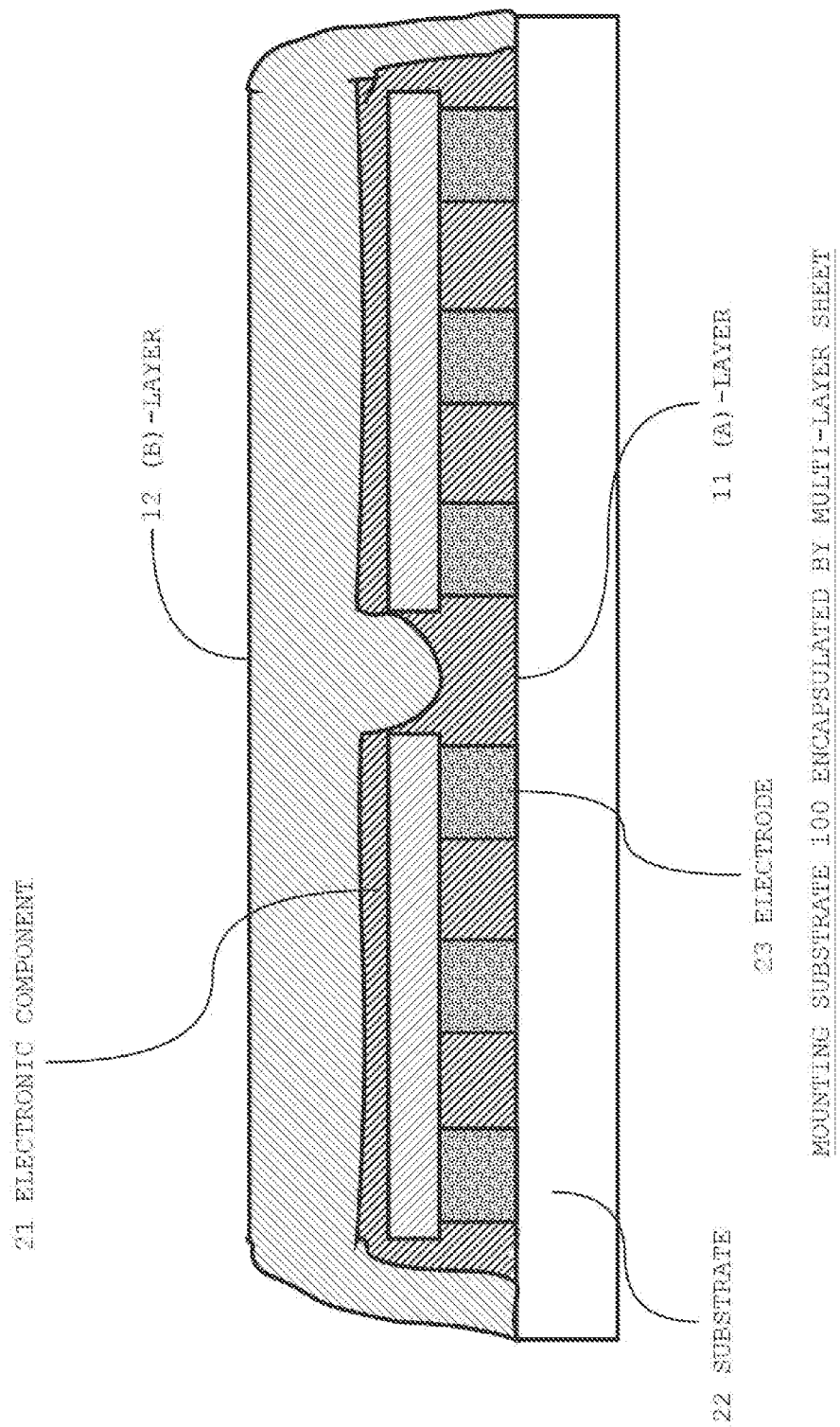
FIG. 4 is a schematic explanatory diagram of an electronic component mounting substrate that has been subjected to mold underfill encapsulation with the multi-layer sheet of the present invention.

FIG. 4 is a schematic explanatory diagram of an electronic component mounting substrate that has been subjected to mold underfill encapsulation with the multi-layer sheet 10. Since the multi-layer sheet 10 contains an (A)-layer having a local maximum value of tan δ (loss tangent) of 3 or more at a measurement temperature of 125° C. for a measurement time of 0 to 100 seconds, the multi-layer sheet 10 can more efficiently infiltrate between the electrodes of an electronic component mounting substrate, and therefore, the multi-layer sheet 10 is an electronic component mounting substrate having excellent heat resistance and moisture resistance.

EXAMPLES

Hereinafter, the present invention will be described in more detail by describing Examples; however, the present invention is not intended to be limited to these.
<Production of Multi-Layer Sheet>
(1) Production of (A)-layer An epoxy resin, a curing agent, a filler (fused silica FB510MDX1: manufactured by DENKA Co., Ltd.), carbon black (particle size 24 nm), a silane coupling agent (KBM503: manufactured by Shin-Etsu Silicone Co., Ltd.), an ion scavenger (inorganic ion exchanger), and a curing accelerator were mixed according to each blend shown in Table 1-1 to Table 1-4, the mixture was heated by a roll kneading machine at 120° C. for 30 minutes and then melt-kneaded, and a kneading product was prepared. The numerical values in the tables are all in parts by mass. Next, the kneaded product thus obtained was applied on a release-treated film by a T-die extrusion method under the conditions of 100° C. to form into a sheet shape, and an (A)-layer having a thickness of 20 to 300 μm, a length of 500 mm, and a width of 500 mm was produced. As the release treatment film, a silicone release-treated polyethylene terephthalate film having a thickness of 50 μm was used.
(2) Production of (B)-Layer 100 parts by mass of a biphenyl type epoxy resin, 50 parts by mass of a solid phenol novolac resin, 1360 parts by mass of a filler (fused silica FB510MDX1: manufactured by DENKA Co., Ltd.), 2 parts by mass of carbon black (particle size 24 nm), 2 parts by mass of a silane coupling agent (KBM503: manufactured by Shin-Etsu Silicone Co., Ltd.), 5 parts by mass of an ion scavenger (inorganic ion exchanger), and 10 parts by mass of a curing accelerator (triarylphosphine-based compound) were blended, the blend was heated by a roll kneading machine at 120° C. for 30 minutes and then melt-kneaded, and a kneading product was prepared. Next, the obtained kneading product was applied on a release-treated film by a T-die extrusion method under the conditions of 100° C. to form a sheet shape, and a (B)-layer having a thickness of 50 to 800 μm, a length of 500 mm, and a width of 500 mm was produced. As the release-treated film, a silicone release-treated polyethylene terephthalate film having a thickness of 50 μm was used.
(3) Production of Multi-Layer Sheet for Mold Underfill Encapsulation The (A)-layer and the (B)-layer produced as described above were laminated so as to be in contact with each other, the layers were stuck together by a laminator at a temperature of 60° C., and a mold underfill encapsulated sheet was produced.
<Measurement of Local Maximum Value of Tan δ (Loss Tangent)>

For the resin composition constituting the (A)-layer obtained as described above, tan δ was measured. Measurement was carried out with a test specimen having a diameter of 25 mmΦ by using a viscoelasticity analyzer (manufactured by TA Instruments, Inc., ARES-LS2) under the conditions of a measurement temperature of 125° C., a measurement time of 0 to 100 seconds, and a frequency of 1 Hz. The measurement results are shown in Table 1-1 to Table 1-4.
<Mold Underfill Test 1>
(Test for Infiltrability Between Electrodes)

On a chip for test mounted on a glass plate, the chip having a bump height of 30 μm and a dimension of 25 mm in length and 25 mm in width, the mold underfill encapsulated sheet produced as described above was placed such that the (A)-layer came into contact with the chip for test, and the assembly was pre-cured at a molding pressure of 3 MPa at 125° C. for 10 minutes and then was post-cured at 150° C. for 60 minutes. The evaluation of infiltrability was carried out according to the following criteria, by making direct observation of the assembly through the back surface of the glass plate.
[Criteria for Infiltrability Evaluation]
⊙: The size of an uninfiltrated part is 500 μm or less.
○: The size of the uninfiltrated part is larger than 500 μm and 1000 μm or less.
X: The size of the uninfiltrated part is larger than 1000 μm.

TABLE 1-1

| | Type | Maximum particle size (μm) | Median diameter D50 (μm) | Comparative Example 1 | Example 1 | Example 2 | Example 3 | Example 4 | Example 5 | Example 6 | Example 7 | Example 8 | Example 9 |
|---|---|---|---|---|---|---|---|---|---|---|---|---|---|
| Curable resin | Biphenyl type epoxy resin | | | 100 | 100 | 100 | 100 | 100 | 100 | 100 | 100 | 100 | 100 |
| | Bisphenol A type epoxy resin | | | | | | | | | | | | |
| | Bisphenol F type epoxy resin | | | | | | | | | | | | |
| | Naphthalene type epoxy resin | | | | | | | | | | | | |
| | Glycidylamine type epoxy resin | | | | | | | | | | | | |
| | Phenol novolac type epoxy resin | | | | | | | | | | | | |
| | Dicyclopentadiene type epoxy resin | | | | | | | | | | | | |
| | Polyether-modified type epoxy resin | | | | | | | | | | | | |

TABLE 1-1-continued

| | Type | Maximum particle size (μm) | Median diameter D50 (μm) | Comparative Example 1 | Example 1 | 2 | 3 | 4 | 5 | 6 | 7 | 8 | 9 |
|---|---|---|---|---|---|---|---|---|---|---|---|---|---|
| Curing agent | Solid phenol novolac | | | 55 | 55 | 55 | 55 | 55 | 55 | 55 | 55 | 55 | 55 |
| | Solid phenol | | | | | | | | | | | | |
| | Liquid phenol novolac | | | | | | | | | | | | |
| | Liquid acid anhydride | | | | | | | | | | | | |
| | Solid acid anhydride | | | | | | | | | | | | |
| Filler | Fused silica | 45 | | | | | | | | | | 500 | |
| | | 20 | 7.2 | | | | | | 500 | | | | |
| | | 10 | 2.8 | | 390 | 670 | 500 | | | 170 | 70 | | 390 |
| | | 5 | 1.8 | 550 | | | | 320 | | | | | |
| | | 5 | 0.3 | 100 | | | | 60 | | | | | |
| | | 5 | 0.1 | 20 | | | | 10 | | | | | |
| | Carbon black | | | 2 | 2 | 2 | 2 | 2 | 2 | 2 | 2 | 2 | 2 |
| | Silane coupling agent | | | 2 | 2 | 2 | 2 | 2 | 2 | 2 | 2 | 2 | 2 |
| | Ion scavenger | | | 5 | 5 | 5 | 5 | 5 | 5 | 5 | 5 | 5 | 5 |
| Curing accelerator | Imidazole-based compound | 50 | 17 | | | | | | | | | | 3 |
| | Triarylphosphine-based compound | 10 | 1.5 | 3 | 3 | 3 | 3 | 3 | 3 | 3 | 3 | 3 | |
| | Filler content [mass %] | | | 80 | 70 | 80 | 75 | 70 | 70 | 50 | 30 | 75 | 70 |
| | (A)-layer thickness [μm] | | | 50 | 50 | 50 | 50 | 50 | 50 | 50 | 50 | 50 | 50 |
| | (B)-layer thickness [μm] | | | 350 | 350 | 350 | 350 | 350 | 350 | 350 | 350 | 350 | 350 |
| | Thickness ratio (B/A) | | | 7 | 7 | 7 | 7 | 7 | 7 | 7 | 7 | 7 | 7 |
| Evaluation | tan δ | | | 1 | 8 | 3 | 5 | 5 | 10 | 23 | 32 | 10 | 8 |
| | Infiltrability between electrodes | | | X | ⊙ | ○ | ⊙ | ⊙ | ⊙ | ⊙ | ⊙ | Δ | ○ |

TABLE 1-2

| | Type | Maximum particle size (μm) | Median diameter D50 (μm) | Example 1 | 10 | 11 | 12 | 13 | 14 | 15 | 16 | 17 |
|---|---|---|---|---|---|---|---|---|---|---|---|---|
| Curable resin | Biphenyl type epoxy resin | | | 100 | | | | | | | | |
| | Bisphenol A type epoxy resin | | | | 100 | | | | | | | |
| | Bisphenol F type epoxy resin | | | | | 100 | | | | | | |
| | Naphthalene type epoxy resin | | | | | | 100 | | | | | |
| | Glycidylamine type epoxy resin | | | | | | | 100 | | | | |
| | Phenol novolac type epoxy resin | | | | | | | | 80 | | 70 | |
| | Dicyclopentadiene type epoxy resin | | | | | | | | | 80 | | 70 |
| | Polyether-modified type epoxy resin | | | | | | | | 20 | 20 | 20 | 20 |
| Curing agent | Solid phenol novolac | | | 55 | 57 | 55 | 75 | 108 | 54 | 54 | 55 | 55 |
| | Solid phenol | | | | | | | | | | | |
| | Liquid phenol novolac | | | | | | | | | | | |
| | Liquid acid anhydride | | | | | | | | | | | |
| | Solid acid anhydride | | | | | | | | | | | |
| Filler | Fused silica | 45 | | | | | | | | | | |
| | | 20 | 7.2 | | | | | | | | | |
| | | 10 | 2.8 | 390 | 510 | 390 | 560 | 660 | 390 | 390 | 390 | 390 |
| | | 5 | 1.8 | | | | | | | | | |
| | | 5 | 0.3 | | | | | | | | | |
| | | 5 | 0.1 | | | | | | | | | |
| | Carbon black | | | 2 | 2 | 2 | 2 | 2 | 2 | 2 | 2 | 2 |
| | Silane coupling agent | | | 2 | 2 | 2 | 2 | 2 | 2 | 2 | 2 | 2 |
| | Ion scavenger | | | 5 | 5 | 5 | 5 | 5 | 5 | 5 | 5 | 5 |
| Curing accelerator | Imidazole-based compound | 50 | 17 | | | | | | | | | |
| | Triarylphosphine-based compound | 10 | 1.5 | 3 | 3 | 3 | 3 | 3 | 3 | 3 | 3 | 3 |
| | Filler content [mass %] | | | 70 | 75 | 70 | 75 | 75 | 70 | 70 | 70 | 70 |
| | (A)-layer thickness [μm] | | | 50 | 50 | 50 | 50 | 50 | 50 | 50 | 50 | 50 |
| | (B)-layer thickness [μm] | | | 350 | 350 | 350 | 350 | 350 | 350 | 350 | 350 | 350 |
| | Thickness ratio (B/A) | | | 7 | 7 | 7 | 7 | 7 | 7 | 7 | 7 | 7 |
| Evaluation | tan δ | | | 8 | 12 | 8 | 10 | 11 | 7 | 7 | 8 | 8 |
| | Infiltrability between electrodes | | | ⊙ | ⊙ | ⊙ | ⊙ | ⊙ | ⊙ | ⊙ | ⊙ | ⊙ |

TABLE 1-3

| | Type | Maximum particle size (μm) | Median diameter D50 (μm) | Example 1 | 18 | 19 | 20 | 21 |
|---|---|---|---|---|---|---|---|---|
| Curable resin | Biphenyl type epoxy resin | | | 100 | | | | 100 |
| | Bisphenol A type epoxy resin | | | | | | | |
| | Bisphenol F type epoxy resin | | | | | | | |
| | Naphthalene type epoxy resin | | | | | | | |
| | Glycidylamine type epoxy resin | | | | | | | |
| | Phenol novolac type epoxy resin | | | | 80 | | | |
| | Dicyclopentadiene type epoxy resin | | | | | 100 | 100 | |
| | Polyether-modified type epoxy resin | | | | 20 | | | |
| Curing agent | Solid phenol novolac | | | 55 | 25 | 21 | 21 | 27 |
| | Solid phenol | | | | 25 | | | |
| | Liquid phenol novolac | | | | | 28 | | |
| | Liquid acid anhydride | | | | | | 34 | |
| | Solid acid anhydride | | | | | | | 91 |
| Filler | Fused silica | 45 | | | | | | |
| | | 20 | 7.2 | | | | | |
| | | 10 | 2.8 | 390 | 380 | 380 | 390 | 540 |
| | | 5 | 1.8 | | | | | |
| | | 5 | 0.3 | | | | | |
| | | 5 | 0.1 | | | | | |
| | Carbon black | | | 2 | 2 | 2 | 2 | 2 |
| | Silane coupling agent | | | 2 | 2 | 2 | 2 | 2 |
| | Ion scavenger | | | 5 | 5 | 5 | 5 | 5 |
| Curing accelerator | Imidazole-based compound | 50 | 17 | | | | | |
| | Triarylphosphine-based compound | 10 | 1.5 | 3 | 3 | 3 | 3 | 3 |
| | Filler content [mass %] | | | 70 | 70 | 70 | 70 | 70 |
| | (A)-layer thickness [μm] | | | 50 | 50 | 50 | 50 | 50 |
| | (B)-layer thickness [μm] | | | 350 | 350 | 350 | 350 | 350 |
| | Thickness ratio (B/A) | | | 7 | 7 | 7 | 7 | 7 |
| Evaluation | tan δ | | | 8 | 8 | 9 | 10 | 5 |
| | Infiltrability between electrodes | | | ⊙ | ⊙ | ⊙ | ⊙ | ⊙ |

TABLE 1-4

| | Type | Maximum particle size (μm) | Median diameter D50 (μm) | Example 1 | 22 | 23 | 24 | 25 |
|---|---|---|---|---|---|---|---|---|
| Curable resin | Biphenyl type epoxy resin | | | 100 | 100 | 100 | 100 | 100 |
| | Bisphenol A type epoxy resin | | | | | | | |
| | Bisphenol F type epoxy resin | | | | | | | |
| | Naphthalene type epoxy resin | | | | | | | |
| | Glycidylamine type epoxy resin | | | | | | | |
| | Phenol novolac type epoxy resin | | | | | | | |
| | Dicyclopentadiene type epoxy resin | | | | | | | |
| | Polyether-modified type epoxy resin | | | | | | | |
| Curing agent | Solid phenol novolac | | | 55 | 55 | 55 | 55 | 55 |
| | Solid phenol | | | | | | | |
| | Liquid phenol novolac | | | | | | | |
| | Liquid acid anhydride | | | | | | | |
| | Solid acid anhydride | | | | | | | |
| Filler | Fused silica | 45 | | | | | | |
| | | 20 | 7.2 | | | | | |
| | | 10 | 2.8 | 390 | 390 | 390 | 390 | 390 |
| | | 5 | 1.8 | | | | | |
| | | 5 | 0.3 | | | | | |
| | | 5 | 0.1 | | | | | |
| | Carbon black | | | 2 | 2 | 2 | 2 | 2 |
| | Silane coupling agent | | | 2 | 2 | 2 | 2 | 2 |
| | Ion scavenger | | | 5 | 5 | 5 | 5 | 5 |
| Curing accelerator | Imidazole-based compound | 50 | 17 | | | | | |
| | Triarylphosphine-based compound | 10 | 1.5 | 3 | 3 | 3 | 3 | 3 |
| | Filler content [mass %] | | | 70 | 70 | 70 | 70 | 70 |
| | (A)-layer thickness [μm] | | | 50 | 20 | 40 | 300 | 300 |
| | (B)-layer thickness [μm] | | | 350 | 350 | 350 | 50 | 800 |
| | Thickness ratio (B/A) | | | 7 | 17.5 | 8.75 | 0.17 | 2.67 |
| Evaluation | tan δ | | | 8 | 8 | 8 | 8 | 8 |
| | Infiltrability between electrodes | | | ⊙ | ○ | ⊙ | ⊙ | ⊙ |

From the results of Table 1-1 to Table 1-4, when the Examples and the Comparative Examples are compared, it was found that when the local maximum value of tan δ of the resin composition constituting the (A)-layer at a measurement temperature of 125° C. for a measurement time of 0 to 100 seconds is 3 or more, an encapsulated sheet having excellent infiltrability between electrodes can be obtained.

Furthermore, when Example 1 and Example 9 were compared, it was found that a sheet produced using a curing accelerator having a median diameter of 10 μm or less exhibits superior infiltrability between electrodes.

<Test for Mold Underfill 2>

Various components were mixed at the blend shown in Table 2, the mixture was heated at 120° C. for 30 minutes by means of a roll kneading machine and then was melt-kneaded, and a kneading product was prepared. Next, the obtained kneading product was applied on a release-treated film by a T-die extrusion method under the conditions of 100° C. to form into a sheet shape, and a (B)-layer having a thickness of 200 to 800 μm, a length of 500 mm, and a width of 500 mm was produced. As the release-treated film, a silicone release-treated polyethylene terephthalate film having a thickness of 50 μm was used.

The (A)-layer and the (B)-layer of the blends used in Example 1 of Table 1-1 were laminated so as to be in contact with each other, the layers were stuck together by a laminator at a temperature of 60° C., and a mold underfill encapsulated sheet was produced.

Next, a test for infiltrability between electrodes was carried out as described above, using the obtained mold underfill encapsulated sheet. The evaluation criteria are the same as described above.

Furthermore, an evaluation of the amount of warpage was carried out using the following method.

(Evaluation of Amount of Warpage)

On a silicon wafer having a diameter of 12 inches×a thickness of 775 μm, the mold underfill encapsulated sheet was placed and was subjected to pre-curing at a molding pressure of 3 MPa at 125° C. for 10 minutes followed by post-curing at 150° C. for 60 minutes.

[Evaluation Criteria for Amount of Warpage]

After the above-described post-curing, the mold underfill encapsulated sheet was cooled to room temperature, and the amount of warpage was evaluated according to the following criteria. Regarding the measurement method, the average of the difference in height between the substrate side center part of the silicon wafer and the two end points of the wafer was measured using a laser displacement meter, the value was designated as the amount of warpage, and an evaluation was carried out according to the following criteria.

○: The warpage is 12 mm or less.
X: The warpage is larger than 12 mm.

TABLE 2

| | | Example | | | | | | |
|---|---|---|---|---|---|---|---|---|
| | Type | 26 | 27 | 28 | 29 | 30 | 31 | 32 |
| Curable resin | Biphenyl type epoxy resin | 50 | 100 | 100 | 100 | 100 | 100 | 100 |
| | Phenol novolac type epoxy resin | | | | | | | |
| | Phenolphthalein type epoxy resin | | | | | | | |
| | Polyether-modified type epoxy resin | 30 | | | | | | |
| | Bisphenol-modified type epoxy resin | 20 | | | | | | |
| Curing agent | Solid phenol novolac | 40 | 50 | 50 | 50 | 50 | 50 | 50 |
| Thermoplastic resin | Polyester resin | | | | 100 | | | |
| | Acrylic resin | | | | | | | |
| | Acrylic resin | | | | | | | |
| | Silicone resin | | | | | | | |
| Filler | Fused silica | 160 | 680 | 810 | 1360 | 1360 | 1360 | 1360 |
| | Carbon black | 2 | 2 | 2 | 2 | 2 | 2 | 2 |
| | Silane coupling agent | 2 | 2 | 2 | 2 | 2 | 2 | 2 |
| | Ion scavenger | 5 | 5 | 5 | 5 | 5 | 5 | 5 |
| Curing accelerator | Triarylphosphine-based compound | 10 | 10 | 10 | 10 | 10 | 10 | 10 |
| | Filler content [mass %] | 50 | 80 | 75 | 89 | 89 | 89 | 89 |
| | (A)-layer thickness [μm] | 50 | 50 | 50 | 500 | 300 | 300 | 300 |
| | (B)-layer thickness [μm] | 200 | 200 | 200 | 200 | 50 | 300 | 800 |
| | Thickness ratio (B/A) | 4 | 4 | 4 | 0.4 | 0.17 | 1.0 | 2.67 |
| Evaluation | Modulus E' [Gpa] | 8 | 20 | 10 | 31 | 31 | 31 | 31 |
| | Coefficient of thermal expansion α [ppm/K] | 38 | 14 | 33 | 7 | 7 | 7 | 7 |
| | α × E' [Pa/K] | 304000 | 280000 | 330000 | 217000 | 217000 | 217000 | 217000 |
| | Warpage evaluation | X | X | X | X | X | Δ | ○ |
| | Infiltrability between electrodes | ⊙ | ⊙ | ⊙ | ⊙ | ⊙ | ⊙ | ⊙ |

| | | Example | | | | | | |
|---|---|---|---|---|---|---|---|---|
| | Type | 33 | 34 | 35 | 36 | 37 | 38 | 39 |
| Curable resin | Biphenyl type epoxy resin | 100 | 100 | 100 | | | | |
| | Phenol novolac type epoxy resin | | | | 40 | | | |
| | Phenolphthalein type epoxy resin | | | | | 60 | 40 | 60 |
| | Polyether-modified type epoxy resin | | | | 30 | 20 | 30 | 20 |
| | Bisphenol-modified type epoxy resin | | | | 30 | 20 | 30 | 20 |
| Curing agent | Solid phenol novolac | 50 | 50 | 50 | 37 | 35 | 23 | 35 |
| Thermoplastic resin | Polyester resin | | | | | | | |
| | Acrylic resin | | | 20 | | | | |
| | Acrylic resin | | | | | | 150 | 150 |
| | Silicone resin | | | | 30 | 20 | | |

TABLE 2-continued

| Filler | Fused silica | 1360 | 1070 | 1130 | 1300 | 910 | 1050 | 910 |
|---|---|---|---|---|---|---|---|---|
| | Carbon black | 2 | 2 | 2 | 2 | 2 | 2 | 2 |
| | Silane coupling agent | 2 | 2 | 2 | 2 | 2 | 2 | 2 |
| | Ion scavenger | 5 | 5 | 5 | 5 | 5 | 5 | 5 |
| Curing accelerator | Triarylphosphine-based compound | 10 | 10 | 10 | 10 | 10 | 10 | 10 |
| | Filler content [mass %] | 89 | 85 | 85 | 88 | 75 | 88 | 75 |
| | (A)-layer thickness [μm] | 50 | 50 | 50 | 50 | 50 | 50 | 100 |
| | (B)-layer thickness [μm] | 200 | 200 | 200 | 200 | 200 | 200 | 800 |
| | Thickness ratio (B/A) | 4 | 4 | 4 | 4 | 4 | 4 | 8 |
| Evaluation | Modulus E' [GPa] | 31 | 25 | 15 | 13 | 7 | 22 | 7 |
| | Coefficient of thermal expansion α [ppm/K] | 7 | 10 | 9 | 7 | 7 | 7 | 7 |
| | α × E' [Pa/K] | 217000 | 250000 | 135000 | 91000 | 49000 | 154000 | 49000 |
| | Warpage evaluation | ○ | ○ | ○ | ○ | ○ | ○ | ○ |
| | Infiltrability between electrodes | ⊙ | ⊙ | ⊙ | ⊙ | ⊙ | ⊙ | ⊙ |

From the results of Table 2, it was found that a sheet comprising a (B)-layer formed from a resin composition in which the coefficient of thermal expansion α [ppm/K] at 80° C. or lower and the storage modulus E' [GPa] at 25° C. of the thermoset product satisfy Formula (1), exhibits an excellent effect of low warpage.

In addition, when Example 29 and Example 30 were compared, it was found that when the thickness of the (A)-layer is 500 μm or less, an excellent effect of low warpage is exhibited. On the other hand, it was found that when the thickness of the (A)-layer is more than 500 μm, an effect of low warpage cannot be exhibited.

INDUSTRIAL APPLICABILITY

With the multi-layer sheet for mold underfill encapsulation of the present invention, narrow gap filling and overall encapsulation in a flip-chip process can be carried out all at once. As a result, the multi-layer sheet can be utilized for the encapsulation of integrated circuits and large-scale integrated circuits, which are utilized for IOT, automated driving, and the like.

EXPLANATIONS OF LETTERS OR NUMERALS

10 MULTI-LAYER SHEET
(A)-LAYER
12 (B)-LAYER
20 MOUNTING SUBSTRATE
21 ELECTRONIC COMPONENT
22 SUBSTRATE
23 ELECTRODE
100 ELECTRONIC COMPONENT MOUNTING SUBSTRATE ENCAPSULATED WITH MULTI-LAYER SHEET

The invention claimed is:

1. A multi-layer sheet for mold underfill encapsulation, the multi-layer sheet comprising:
the following (A)-layer as an outermost layer:
(A)-layer: a layer formed from a resin composition having a local maximum value of tan δ (loss tangent) of 3 or more at a measurement temperature of 125° C. for a measurement time of 0 to 100 seconds,
wherein the (A)-layer is configured so as to come into direct contact with an electronic component and a substrate in the mold underfill encapsulation; and
(B)-layer: a layer formed from a resin composition satisfying the following Formula (1),
in the following Formula (1), "α" represents the coefficient of thermal expansion α [ppm/K] at 80° C. or lower of a thermoset product obtained after subjecting the resin composition to a thermosetting treatment at 175° C. for one hour; and "E" represents the storage modulus E' [GPa] at 25° C. of the thermoset product:

$$40000 \leq \alpha \times E' \leq 250000 [Pa/K] \tag{1}$$

2. The multi-layer sheet according to claim 1, wherein the (A)-layer contains a filler, and the maximum particle size of the filler is 20 μm or less.

3. The multi-layer sheet according to claim 1, wherein the (A)-layer contains a curing accelerator whose median diameter (D50) at a cumulative volume of 50% in the volume particle size distribution is 10 μm or less.

4. The multi-layer sheet according to claim 1, wherein the thickness of the (A)-layer is 10 to 500 μm.

5. The multi-layer sheet according to claim 1, wherein the ratio (B/A) of the thickness of the (B)-layer to the thickness of the (A)-layer is 0.1 to 80.

6. A method for mold underfill encapsulation of an electronic component mounting substrate, the method comprising:
a step of preparing a substrate on which an electronic component provided with electrodes having an electrode height (h) of 5 to 250 μm and a width (w) between electrodes of 5 to 500 μm is flip-chip mounted;
a step of preparing a multi-layer sheet having the following (A)-layer as an outermost layer;
a step of placing the multi-layer sheet such that the (A)-layer comes into direct contact with the electronic component and the substrate;
a step of heating and compressing the placed multi-layer sheet:
(A)-layer: a layer formed from a resin composition having a local maximum value of tan δ (loss tangent) of 3 or more at a measurement temperature of 125° C. for a measurement time of 0 to 100 seconds; and
a step of laminating the (A)-layer and the following (B)-layer so as to be in contact with each other,
(B)-layer: a layer formed from a resin composition satisfying the following Formula (1),
in the following Formula (1), "α" represents the coefficient of thermal expansion α [ppm/K] at 80° C. or lower of a thermoset product obtained after subjecting the resin composition to a thermosetting treatment at 175° C. for one hour; and "E" represents the storage modulus E' [GPa] at 25° C. of the thermoset product:

$$40000 \leq \alpha \times E' \leq 250000 [Pa/K] \tag{1}$$

7. The method for mold underfill encapsulation according to claim 6, wherein the (A)-layer contains a filler, and the maximum particle size of the filler is smaller than the electrode height (h) and the width (w) between electrodes.

8. An electronic component mounting substrate being mold underfill encapsulated, wherein the mold underfill encapsulation is encapsulated by a multi-layer sheet having the following (A)-layer as an outermost layer:
(A)-layer: a layer formed from a resin composition having a local maximum value of tan δ (loss tangent) of 3 or more at a measurement temperature of 125° C. for a measurement time of 0 to 100 seconds,
wherein the (A)-layer is configured so as to come into direct contact with an electronic component and a substrate in the mold underfill encapsulation; and
(B)-layer: a layer formed from a resin composition satisfying the following Formula (1),
in the following Formula (1), "α" represents the coefficient of thermal expansion α [ppm/K] at 80° C. or lower of a thermoset product obtained after subjecting the resin composition to a thermosetting treatment at 175° C. for one hour; and "E'" represents the storage modulus E' [GPa] at 25° C. of the thermoset product:

$$40000 \leq \alpha \times E' \leq 250000 [Pa/K] \qquad (1).$$

9. A method for producing a mold underfill encapsulated electronic component mounting substrate, the method comprising:
a step of preparing a substrate having an electronic component flip-chip mounted thereon;
a step of preparing a multi-layer sheet having the following (A)-layer as an outermost layer;
a step of placing the multi-layer sheet such that the (A)-layer comes into direct contact with the electronic component and the substrate; and
a step of heating and compressing the placed multi-layer sheet:
(A)-layer: a layer formed from a resin composition having a local maximum value of tan δ (loss tangent) of 3 or more at a measurement temperature of 125° C. for a measurement time of 0 to 100 seconds; and
a step of laminating the (A)-layer and the following (B)-layer so as to be in contact with each other,
(B)-layer: a layer formed from a resin composition satisfying the following Formula (1),
in the following Formula (1), "α" represents the coefficient of thermal expansion α [ppm/K] at 80° C. or lower of a thermoset product obtained after subjecting the resin composition to a thermosetting treatment at 175° C. for one hour; and "E'" represents the storage modulus E' [GPa] at 25° C. of the thermoset product:

$$40000 \leq \alpha \times E' \leq 250000 [Pa/K] \qquad (1).$$

10. The method for mold underfill encapsulation of an electronic component mounting substrate according to claim 6, wherein in the mold underfill encapsulation, underfill encapsulation of performing encapsulation of electrode portions and overmold encapsulation of performing encapsulation of the entirety including electronic components, are performed all at once.

11. The method for producing a mold underfill encapsulated electronic component mounting substrate according to claim 9, wherein in the mold underfill encapsulation, underfill encapsulation of performing encapsulation of electrode portions and overmold encapsulation of performing encapsulation of the entirety including electronic components, are performed all at once.

* * * * *